(12) United States Patent
Su et al.

(10) Patent No.: US 11,251,131 B2
(45) Date of Patent: Feb. 15, 2022

(54) COPPER CONTACT PLUGS WITH BARRIER LAYERS

(71) Applicant: Taiwan Semiconductor Manufacturing Co., Ltd., Hsinchu (TW)

(72) Inventors: Li-Lin Su, Dongshih (TW); Ching-Hua Hsieh, Hsinchu (TW); Huang-Ming Chen, Hsinchu (TW); Hsueh Wen Tsau, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/904,026

(22) Filed: Jun. 17, 2020

(65) Prior Publication Data

US 2020/0321279 A1    Oct. 8, 2020

Related U.S. Application Data

(60) Continuation of application No. 15/477,738, filed on Apr. 3, 2017, now Pat. No. 10,700,010, which is a
(Continued)

(51) Int. Cl.
*H01L 23/535* (2006.01)
*H01L 29/49* (2006.01)
(Continued)

(52) U.S. Cl.
CPC ...... *H01L 23/535* (2013.01); *H01L 21/28035* (2013.01); *H01L 21/28088* (2013.01); *H01L 21/76805* (2013.01); *H01L 21/76843* (2013.01); *H01L 21/76847* (2013.01); *H01L 21/76879* (2013.01); *H01L 21/76895* (2013.01); *H01L 23/485* (2013.01); *H01L 23/5226* (2013.01); *H01L 23/53238* (2013.01); *H01L 29/49* (2013.01); *H01L 29/495* (2013.01); *H01L 29/4916* (2013.01); *H01L 29/4966* (2013.01);
(Continued)

(58) Field of Classification Search
CPC . H01L 23/535; H01L 23/485; H01L 23/5226; H01L 23/53238; H01L 29/495; H01L 29/4966; H01L 29/49
USPC .................. 257/762, 771, E28.161, E29.139
See application file for complete search history.

(56) References Cited

U.S. PATENT DOCUMENTS 8,728,908 B2    5/2014   Xie et al.
2002/0167090 A1  11/2002  Hsue et al.
(Continued)

*Primary Examiner* — Robert T Huber
(74) *Attorney, Agent, or Firm* — Slater Matsil, LLP

(57) ABSTRACT

A device includes a conductive layer including a bottom portion, and a sidewall portion over the bottom portion, wherein the sidewall portion is connected to an end of the bottom portion. An aluminum-containing layer overlaps the bottom portion of the conductive layer, wherein a top surface of the aluminum-containing layer is substantially level with a top edge of the sidewall portion of the conductive layer. An aluminum oxide layer is overlying the aluminum-containing layer. A copper-containing region is over the aluminum oxide layer, and is spaced apart from the aluminum-containing layer by the aluminum oxide layer. The copper-containing region is electrically coupled to the aluminum-containing layer through the top edge of the sidewall portion of the conductive layer.

20 Claims, 14 Drawing Sheets

Related U.S. Application Data division of application No. 14/852,320, filed on Sep. 11, 2015, now Pat. No. 9,614,052, which is a division of application No. 13/557,592, filed on Jul. 25, 2012, now Pat. No. 9,136,206.

(51) Int. Cl.

| | | |
|---|---|---|
| *H01L 23/532* | (2006.01) | |
| *H01L 23/485* | (2006.01) | |
| *H01L 23/522* | (2006.01) | |
| *H01L 29/66* | (2006.01) | |
| *H01L 21/768* | (2006.01) | |
| *H01L 21/28* | (2006.01) | |

(52) U.S. Cl.
CPC .. *H01L 29/66545* (2013.01); *H01L 23/53223* (2013.01); *H01L 23/53295* (2013.01); *H01L 2924/0002* (2013.01)

(56) References Cited

U.S. PATENT DOCUMENTS

| | | |
|---|---|---|
| 2003/0127678 A1 | 7/2003 | Shimizu et al. |
| 2005/0266679 A1 | 12/2005 | Lin et al. |
| 2005/0277258 A1* | 12/2005 | Huang ............ H01L 21/823475 438/300 |
| 2006/0121678 A1 | 6/2006 | Brask et al. |
| 2007/0099414 A1 | 5/2007 | Frohberg et al. |
| 2007/0290347 A1 | 12/2007 | Dostalik et al. |
| 2008/0057698 A1 | 3/2008 | Ishigami |
| 2008/0157365 A1 | 7/2008 | Ott et al. |
| 2010/0270627 A1 | 10/2010 | Chang et al. |
| 2011/0062501 A1 | 3/2011 | Soss et al. |
| 2011/0101426 A1 | 5/2011 | Frohberg et al. |
| 2011/0171820 A1 | 7/2011 | Tsau et al. |

* cited by examiner

COPPER CONTACT PLUGS WITH BARRIER LAYERS

PRIORITY CLAIM AND CROSS-REFERENCE

This application is a continuation of U.S. patent application Ser. No. 15/477,738 filed on Apr. 3, 2017, entitled "Copper Contact Plugs with Barrier Layers," which is a divisional of U.S. patent application Ser. No. 14/852,320 filed on Sep. 11, 2015, entitled "Copper Contact Plugs with Barrier Layers," now U.S. Pat. No. 9,614,052 issued on Apr. 4, 2017, which is a divisional of U.S. patent application Ser. No. 13/557,592 filed on Jul. 25, 2012, entitled "Copper Contact Plugs with Barrier Layers," now U.S. Pat. No. 9,136,206 issued on Sep. 15, 2015, which applications are incorporated herein by reference in their entirety.

BACKGROUND

Advances in semiconductor processing continue, resulting in further reductions in minimum feature sizes and process scaling. As the semiconductor process nodes advance to smaller minimum feature sizes, for example, of 28 nanometers, 22 nanometers, and below, the areas available for contact plugs on device features such as gates and the respective substrate are reduced. In addition, as materials used in semiconductor processes advance, additional impacts on contact resistance due to the use of these advanced materials are observed. Accordingly, the approaches for reducing the respective impact are being researched.

Contact plugs are used to form the vertical electrical connections between a conductor layer such as a first level metal (known as M1), and a substrate region or a gate region formed below that level in an integrated circuit structure. Commonly used contact plugs include tungsten plugs.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Metal-Oxide-Semiconductor (MOS) device including aluminum-containing gate electrodes and copper-containing contact plugs and the method of forming the same are provided in accordance with various exemplary embodiments. The intermediate stages of forming the MOS device are illustrated. The variations and the operation of the embodiments are discussed. Throughout the various views and illustrative embodiments, like reference numbers are used to designate like elements. In the illustrated embodiments, gate-last approaches are taken to form the aluminum-containing gate electrodes. The aluminum-containing gate electrodes, however, may also be formed using gate-first approaches in accordance with alternative embodiments.

Figure 1:
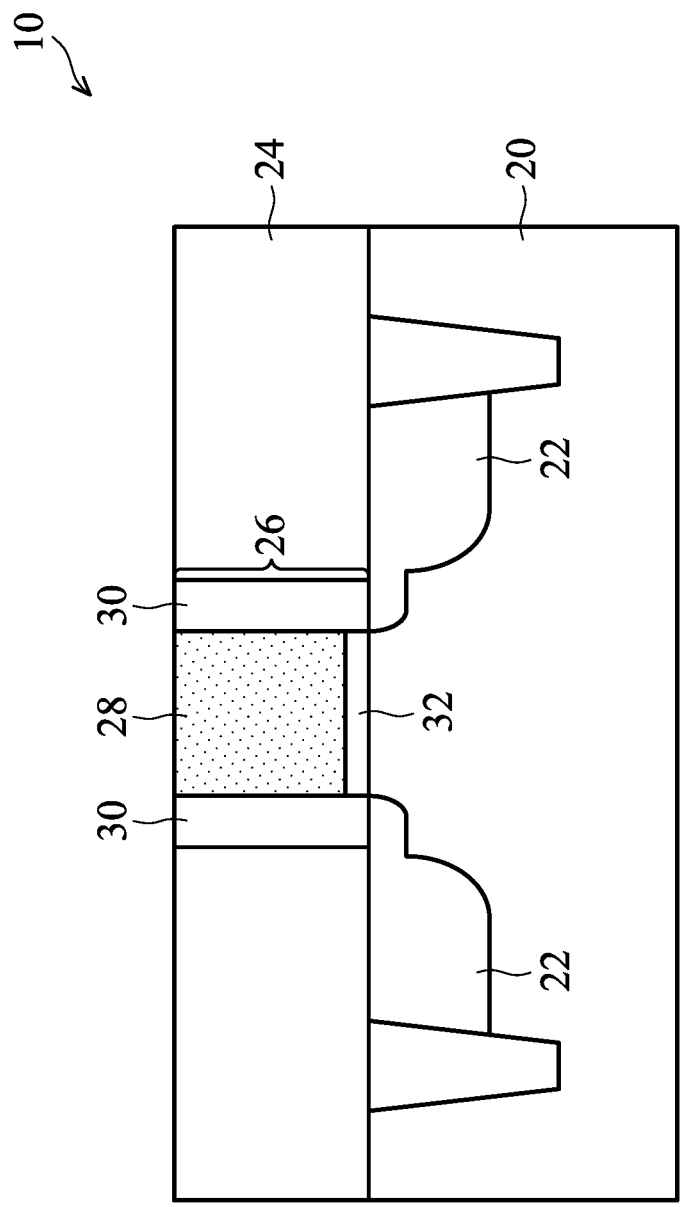
FIGS. 1, 2, 3, 4, 5, 6, 7A, 7B, 7C and 8 are cross-sectional views and top views of intermediate stages in the manufacturing of a Metal-oxide-Semiconductor (MOS) device and overlying structures in accordance with some exemplary embodiments.

FIGS. 1 through 8 are cross-sectional views and top views of intermediate stages in the manufacturing of a MOS device and overlying structures in accordance with some exemplary embodiments. Referring to FIG. 1, wafer 10 is provided. Wafer 10 includes substrate 20, which may be formed of semiconductor materials such as silicon, silicon germanium, silicon carbon, III-V compound semiconductor materials, or the like. Substrate 20 may be a bulk substrate or a Semi-conductor-On-Insulator (SOI) substrate. Source and drain regions (also referred to as source/drain regions hereinafter) 22 are formed in substrate 20. Inter-Layer Dielectric (ILD, referred to as ILD0 hereinafter) 24 is formed over substrate 20. ILD0 24 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Dummy gate structure 26 is formed in ILD0 24. Dummy gate structure 26 includes dummy gate electrode 28, which may be formed of polysilicon, for example, although other materials may also be used. In some embodiments, dummy gate structure 26 further includes dummy spacers 30 and/or dummy gate dielectric 32. In alternative embodiments, dummy spacers 30 and/or dummy gate dielectric 32 are not formed. The top surface of dummy gate structure 26 is level with the top surface of ILD0 24.

Figure 2:
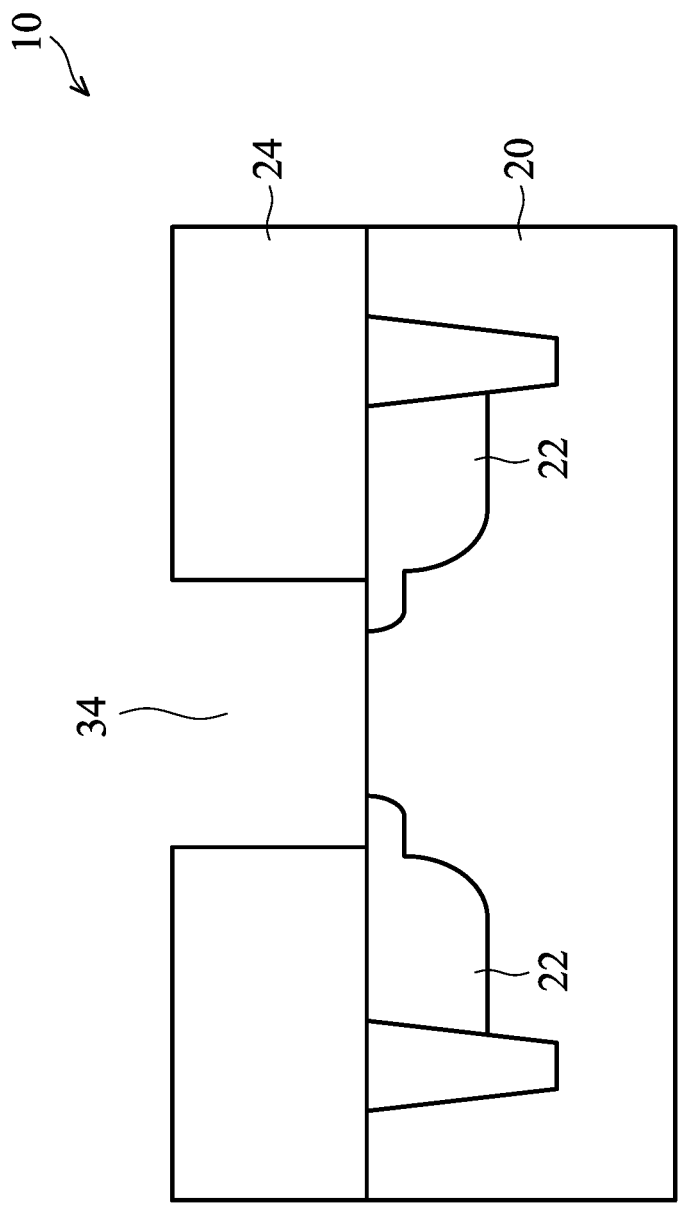
Figure 3:
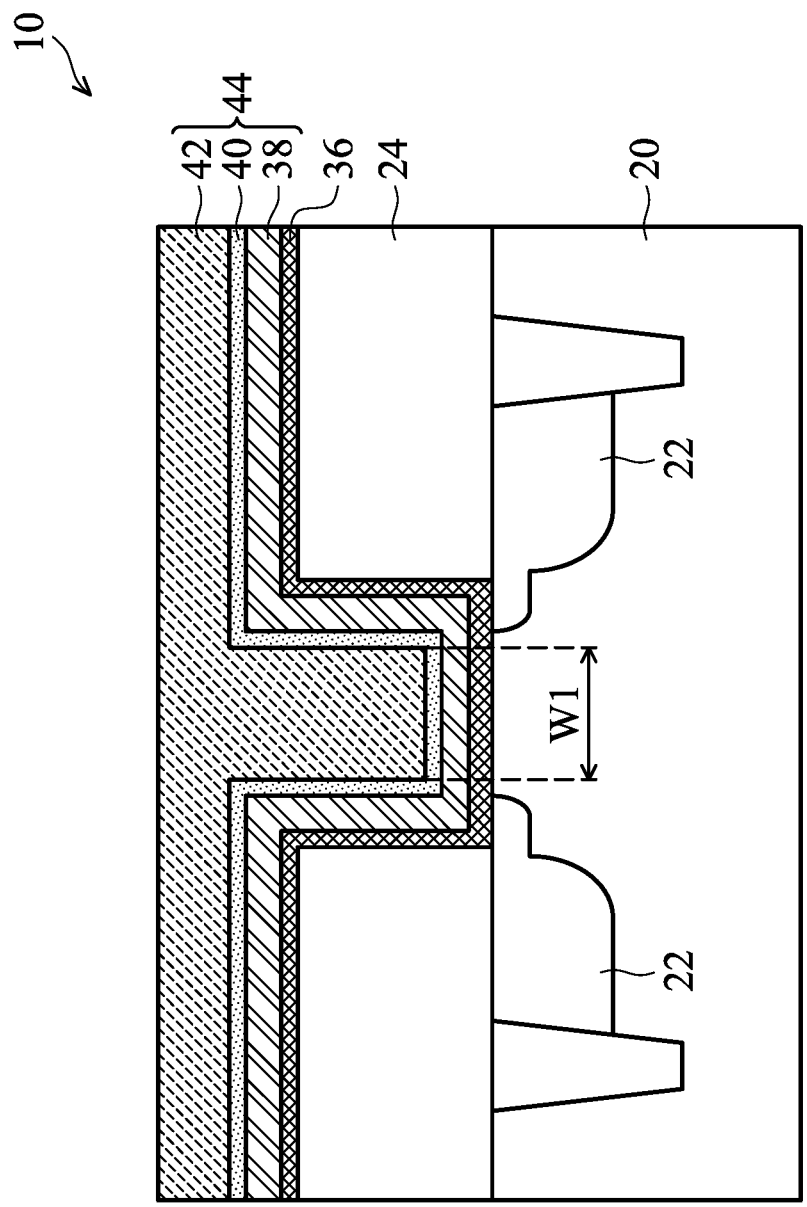

Referring to FIG. 2, dummy gate structure 26 is removed through etching. Accordingly, opening 34 is formed in ILD0 24. As a result, the top surface of substrate 20 is exposed through opening 34 in some exemplary embodiments. Next, referring to FIG. 3, gate dielectric layer 36, which is a dielectric layer, is deposited. Gate electrode layer 44, which is a conductive layer, is further deposited on gate dielectric layer 36. Each of gate dielectric layer 36 and gate electrode layer 44 comprises a portion overlying ILD0 24 and a portion in opening 34 (FIG. 2). In some embodiments, gate dielectric layer 36 and gate electrode layer 44 are conformal layers whose horizontal portions have substantially the same thicknesses as the respective vertical portions.

Gate dielectric layer 36 may be a single layer or a composite layer that comprises a plurality of layers. For example, gate dielectric layer 36 may include an oxide layer and a high-k dielectric layer over the oxide layer. The oxide layer may be a silicon oxide layer formed by deposition. The high-k dielectric layer may comprise hafnium oxide, zirconium oxide, or the like. In some exemplary embodiments, a barrier layer (not shown) formed of titanium nitride, for example, is formed over the high-k dielectric layer.

In some embodiments, gate electrode layer 44 includes conductive layer 38, wetting layer 40 over conductive layer 38, and aluminum-containing layer 42 over wetting layer 40. Conductive layer 38 may comprise polysilicon, TaSiN, WN, TiAl, TiAlN, TaC, or the like. In alternative embodiments, gate electrode layer 44 includes wetting layer 40 over conductive layer 38 and aluminum-containing layer 42 over wetting layer 40. Conductive layer 38, however, is not formed in these embodiments. The thickness of Conductive layer 38 may be between about 1 nm and about 10 nm, although a greater or a smaller thickness may be used. The formation of aluminum-containing layer 42, wetting layer 40, and conductive layer 38 may include Physical Vapor Deposition (PVD), Metal-Organic Chemical Vapor Deposition (MOCVD), and/or other applicable methods, depending on the materials of layers 38, 40, and 42.

Figure 7A:
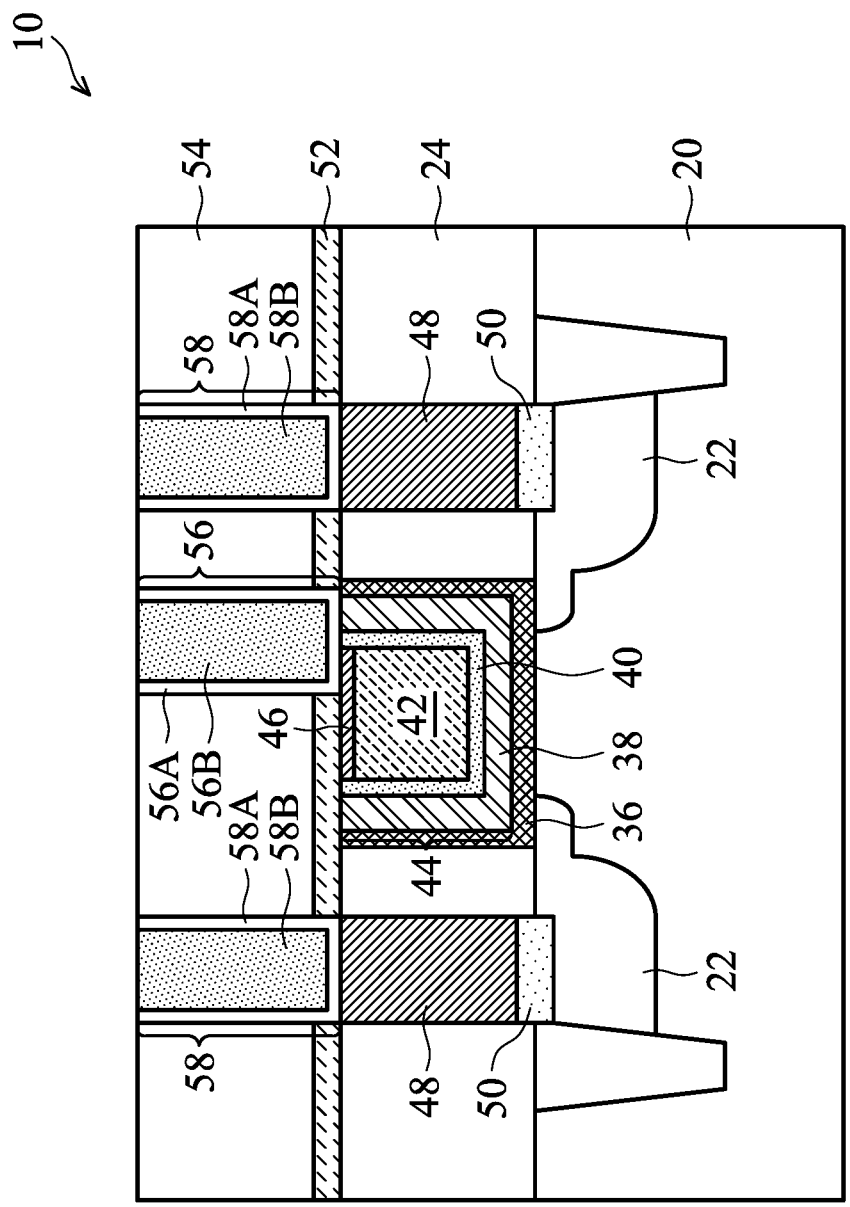

In some exemplary embodiments, aluminum-containing layer 42 has an aluminum atomic percentage greater than about 90 percent, or greater than about 95 percent. It is appreciated, however, that the values recited throughout the description are merely examples, and may be changed to different values. The portion of aluminum-containing layer 42 inside opening 34 (FIG. 2) may have a lateral dimension W1 between about 25 nm and about 1 μm, for example. Wetting layer 40 is used to enhance the adhesion between aluminum-containing layer 42 and conductive layer 38, and may have a thickness between about 1 nm and about 10 nm, for example. Wetting layer 40 may have a titanium atomic percentage greater than about 60 percent. Wetting layer 40 may also comprise a substantially pure titanium layer, which has a titanium atomic percentage greater than about 95 percent, for example. The substantially pure titanium layer (if any), may be in physical contact with the overlying aluminum-containing layer 42. The pure titanium layer may help to prevent the inter-diffusion of aluminum and copper between aluminum-containing layer 42 and the overlying copper-containing regions 56B (FIG. 7A). The reason is that titanium forms a good bond with the overlying aluminum-containing layer 42, and hence it is more difficult for the well-bonded aluminum atoms in aluminum-containing layer 42 to migrate upwardly into copper-containing regions 56B. In alternative embodiments, wetting layer 40 is a single layer or a composite layer comprising Ti, TiN, Ta, TaN, and/or the like.

Figure 4:
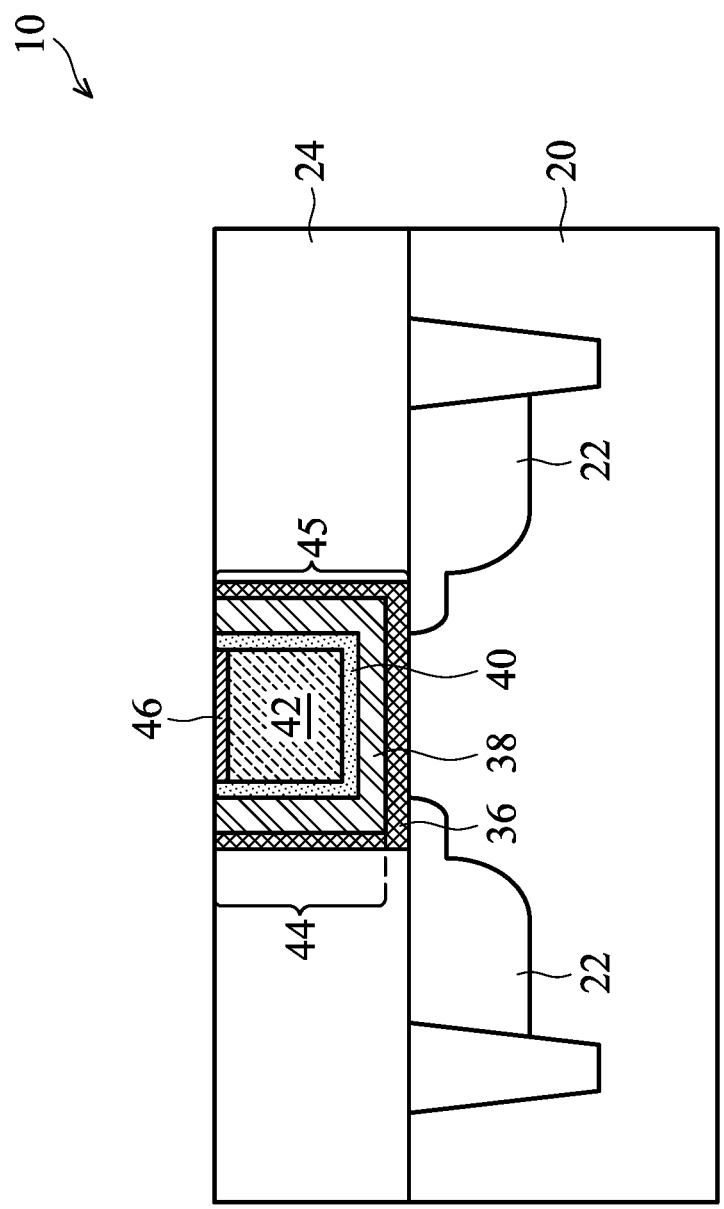

Referring to FIG. 4, a planarization such as a Chemical Mechanical Polish (CMP) is performed to remove excess portions of gate dielectric layer 36 and gate electrode layer 44, which excess portions are over ILD0 24. The resulting structure includes replacement gate stack 45. The remaining portions of gate dielectric layer 36 and gate electrode layer 44 are referred to as gate dielectric 36 and gate electrode 44 hereinafter. In the illustrated embodiments, each of gate dielectric 36, conductive layer 38, and wetting layer 40 includes a bottom portion and sidewall portions over and connected to the opposite ends of the bottom portion. After the CMP, aluminum oxide layer 46 may be formed over, and contacting, the top surface of aluminum-containing layer 42.

Figure 5:
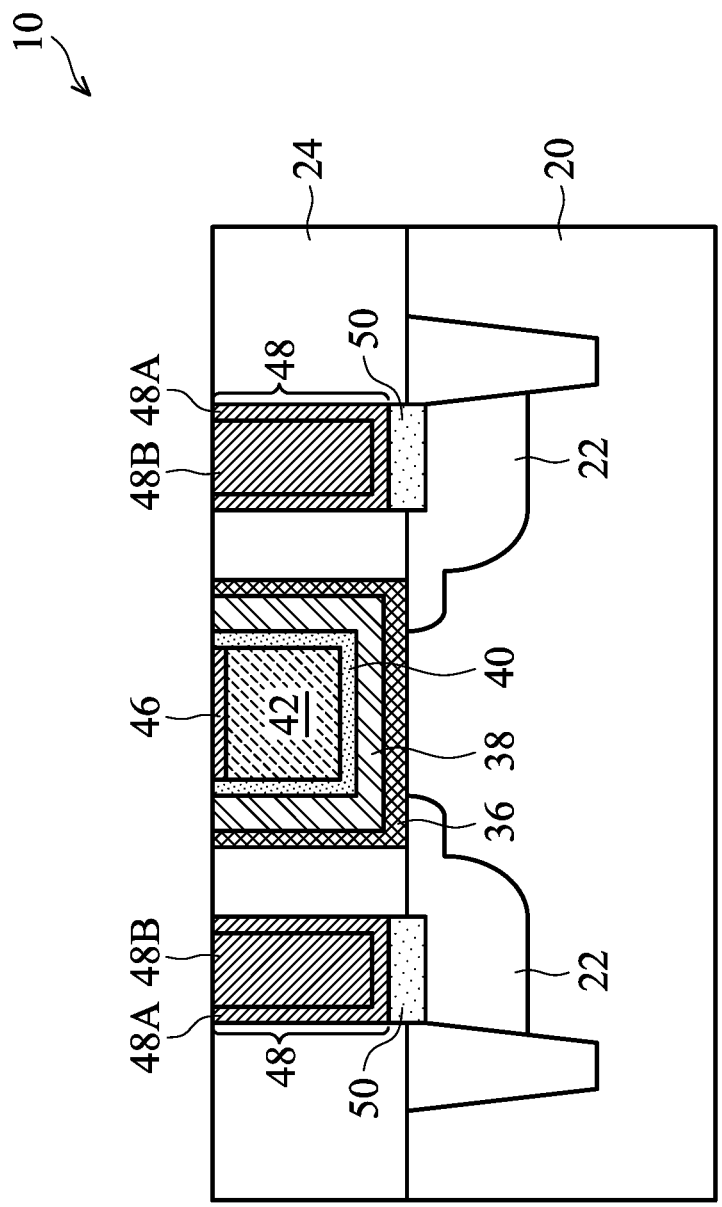

FIG. 5 illustrates the formation of lower source/drain contact plugs 48, which are also referred to as M0_OD1 48 hereinafter, wherein the term "OD" indicates that contact plugs 48 are connected to an active region. An exemplary formation process is briefly discussed as below. The formation process may include etching ILD0 24 to formed openings (occupied by contact plugs 48) in order to expose source and drain regions 22. A self-aligned silicidation is then performed through the openings to form silicide regions 50 at the bottoms of the openings. A conductive material(s) is filled into the openings, followed by a CMP step to remove excess conductive material(s). The remaining portions of the conductive material(s) form contact plugs 48. In some embodiments, M0_OD1s 48 include adhesion/barrier layer 48A, and tungsten plug 48B over adhesion/barrier layer 48A. Adhesion/barrier layer 48A may comprise a material selected from titanium, titanium nitride, tantalum, tantalum nitride, combinations thereof, or multi-layers thereof. Tungsten plugs 48B may be formed of tungsten or a tungsten alloy, for example.

Figure 6:
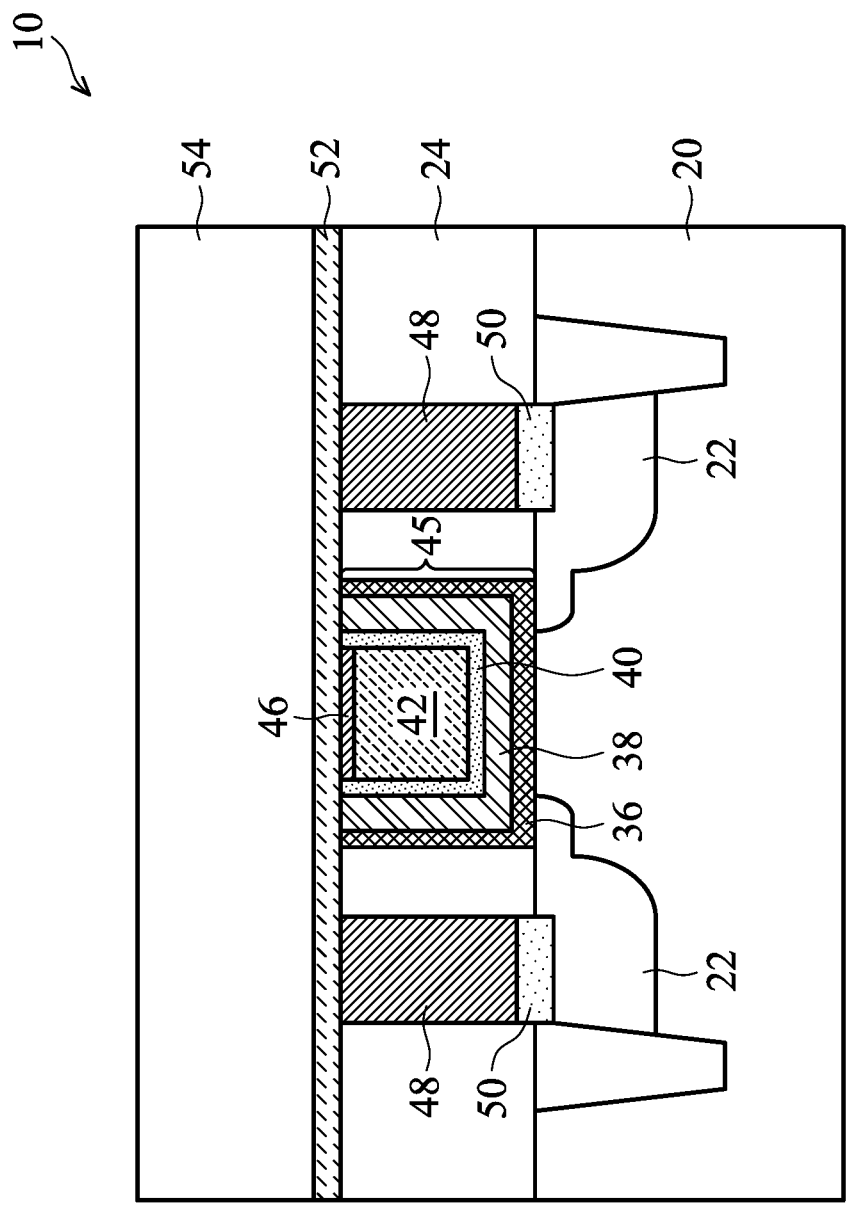

Referring to FIG. 6, etch stop layer 52 is formed over, and may be in physical contact with, the top surfaces of gate structure 45 and ILD0 24. In some embodiments, etch stop layer 52 is formed of silicon nitride. Alternatively, other dielectric materials such as silicon carbide, silicon oxynitride, or the like, may be used. After the formation of etch stop layer 52, another ILD, referred to as ILD1 54, is formed over etch stop layer 52. ILD1 54 may be formed of PSG, BSG, BPSG, TEOS oxide, or the like.

FIG. 7A illustrates the formation of gate contact plug 56 and source/drain contact plugs 58, which may be formed simultaneously, or formed in different process steps. Source/drain contact plugs 58 are also referred to as M0_OD2 or upper source/drain contact plugs hereinafter. Source/drain contact plugs 58 are aligned to, and in contact with, the respective underlying M0_OD1s 48, which are lower source/drain contact plugs. Gate contact plug 56 is electrically coupled to gate electrode 44. Each of gate contact plug 56 and M0_OD2s 58 includes a barrier layer, which is referred to as either 56A or 58A, and a copper-containing region, which is referred to as either 56B or 58B. The formation process may include etching ILD1 54 and etch stop layer 52 to formed openings, and filling the openings with a barrier layer and a copper-containing layer. A CMP is then performed to remove the excess portions of the barrier layer and the copper-containing layer. The remaining portions of the barrier layer form barrier layers 56A and 58A, and the remaining portions of the copper-containing layer form copper-containing regions 56B and 58B.

In some embodiments, barrier layer 56A includes a layer selected from the group consisting of a Ti layer, a TiN layer, a Ta layer, a TaN layer, and multi-layers thereof. When barrier layer 56A (or 58A) includes a substantially pure titanium layer, the substantially pure titanium layer may, or may not, be in physical contact with the bottom surface and the sidewalls of copper-containing region 56B (or 58A). The substantially pure titanium layer is located between copper-containing region 56B and aluminum-containing layer 42, and hence forms a good barrier that prevents the copper in copper-containing region 56B and the aluminum in aluminum-containing layer 42 from diffusing to each other. The thickness of barrier layer 56A may be between about 2 nm and about 20 nm, for example. Copper-containing regions 56B and 58B may have a copper atomic percentage greater than about 80 percent, or close to 100 percent.

Gate contact plug 56 (and the respective barrier layer 56A) includes a portion in contact with the top edge of conductive layer 38, and possibly the top edge of wetting layer 40. In some embodiments, when the opening, in which gate contact plug 56 is to be filled, is exposed, the exposed portion of aluminum oxide layer 46 is not etched. Accordingly, gate contact plug 56 (and the respective barrier layer 56A) may further include a portion over and in contact with the top surface of aluminum oxide layer 46, which is non-conductive. As a result, the electrical coupling between gate electrode 44 and gate contact plug 56 is through the top edges of conductive layer 38 and/or wetting layer 40, and not through the top surface of aluminum-containing layer 42.

Figure 7C:
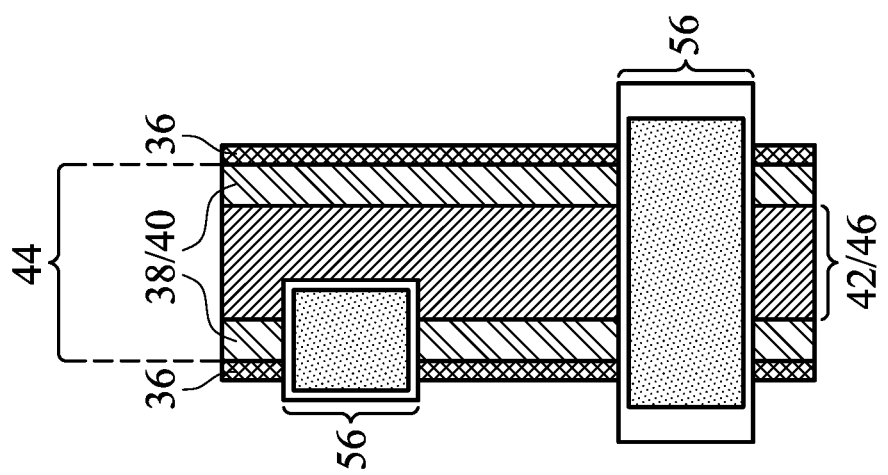
Figure 7B:
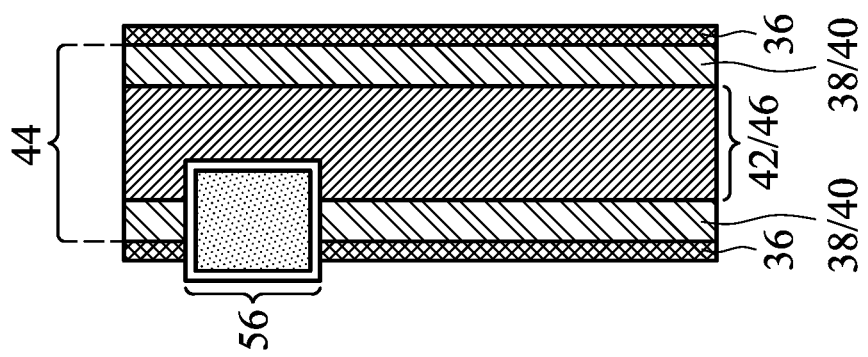

FIGS. 7B and 7C illustrate some exemplary top views of the structure shown in FIG. 7A. Referring to FIG. 7B, gate contact plug 56 may be misaligned with the center of aluminum oxide layer 46. Instead, gate contact plug 56 is aligned to one side of gate electrode 44 in order to contact the top edges of conductive layer 38 and/or wetting layer 40. FIG. 7C illustrates two of gate contact plugs 56 electrically coupled to the same gate electrode 44, with one gate contact plug 56 being wider than gate electrode 44, so that it may be in contact with the portions of layers 38/40 that are on opposite sides of aluminum oxide layer 46. The other gate contact plug 56 is also misaligned with aluminum oxide layer 46 in order to contact layers 38/40.

Figure 8:
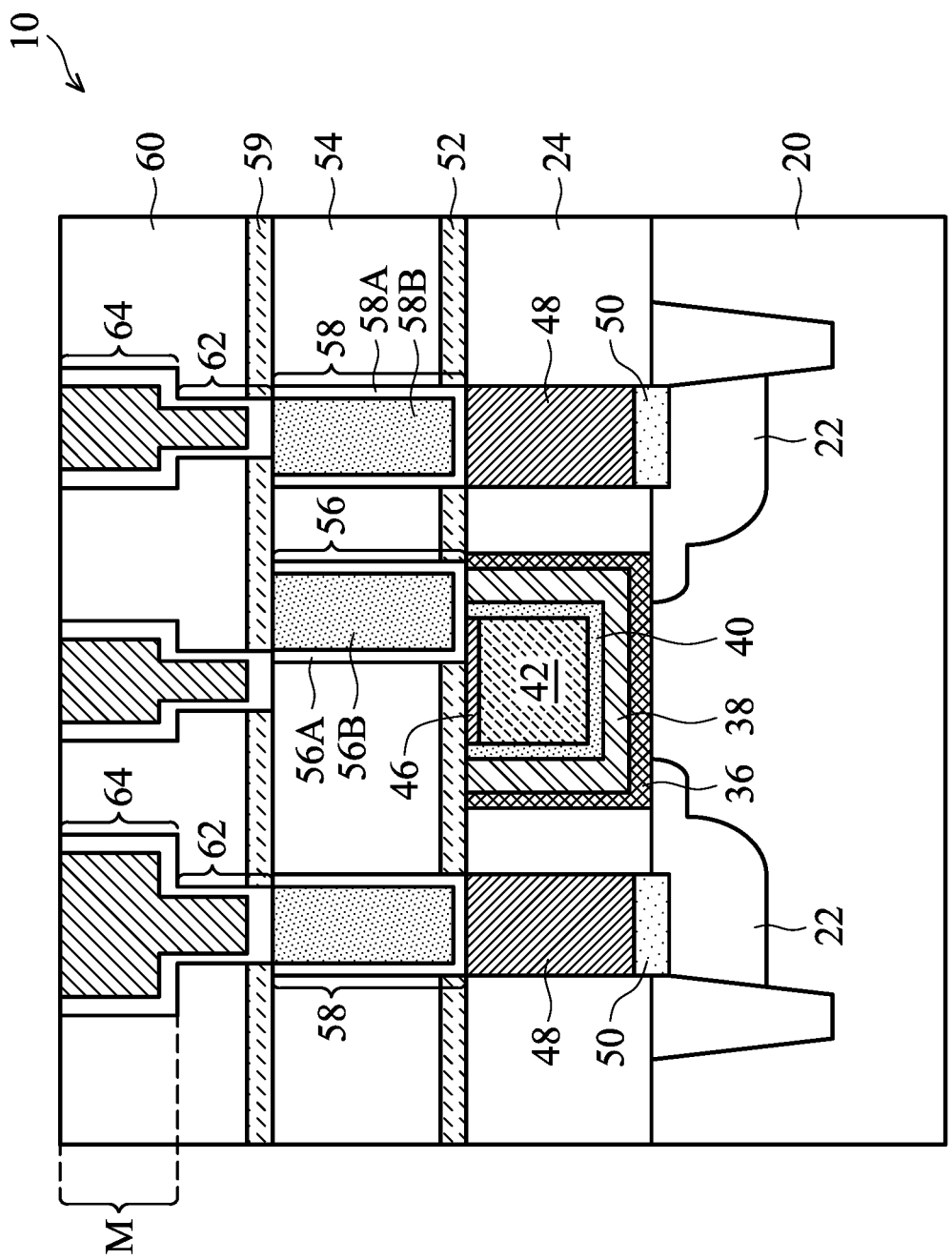

Referring to FIG. 8, in subsequent processes, etch stop layer 59, M0 vias 62, and metal lines 64 are formed in bottom metal layer M1. M0 vias 62 and metal lines 64 are formed in dielectric layer 60, wherein dielectric layer 60 may be formed of a low-k dielectric material having a k value smaller than about 3.0, or smaller than about 2.5, for example. In some embodiments, M0 vias 62 and metal lines 64 are formed using a dual-damascene process, and hence no noticeable interfaces are formed between M0 vias 62 and the respective overlying metal lines 64. In alternative embodiments, M0 vias 62 may be formed using a single-damascene process, and metal lines 64 may also be formed using a single-damascene process. In yet other embodiments, M0 vias 62 are not formed, while metal lines 64 are in contact with contact plugs 56 and 58. M0 vias 62 and metal lines 64 may include a diffusion barrier layer and a copper-containing material over the diffusion barrier layer. In subsequent process, more metal layers (not shown) may be formed over metal layer M1.

Figure 9:
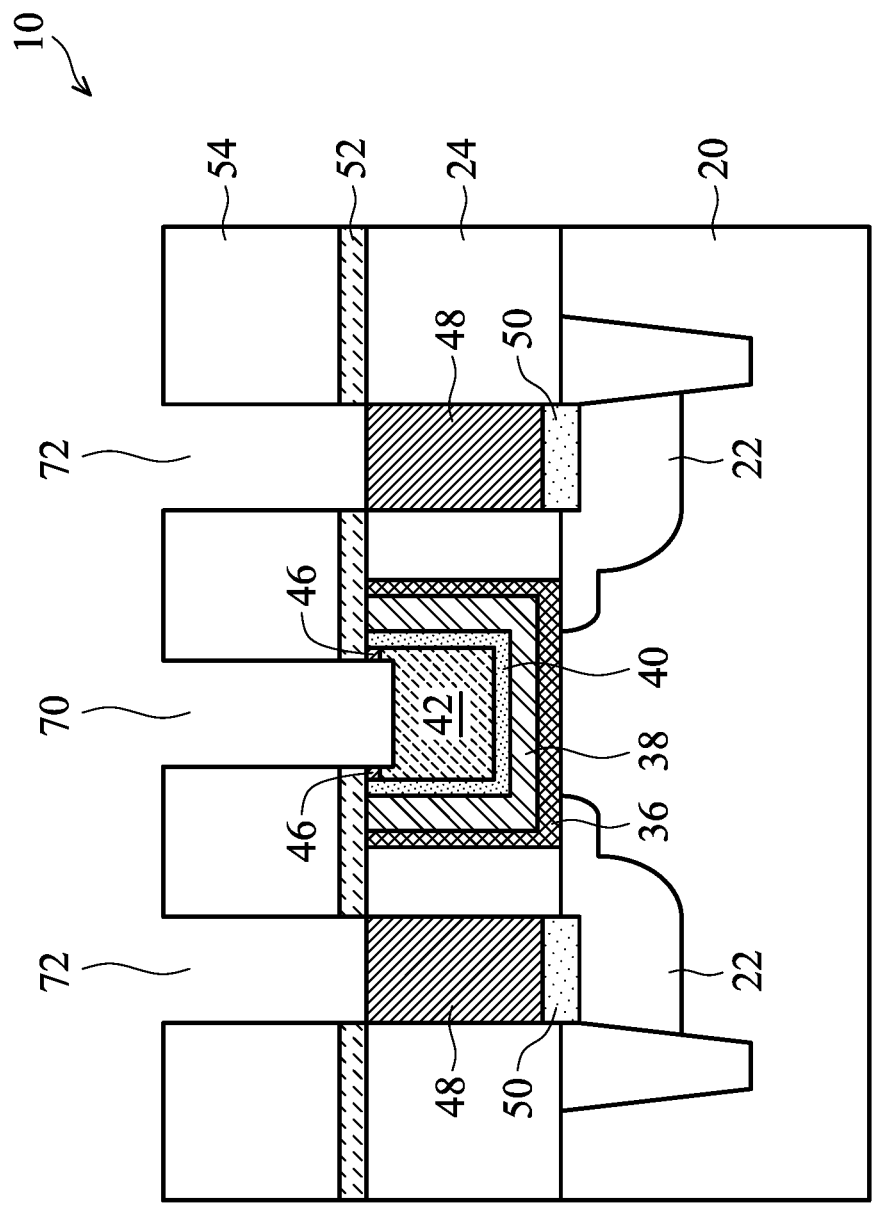
FIGS. 9, 10A, 10B, 10C, 10D, and 11 are cross-sectional views and top views of intermediate stages in the manufacturing of a MOS device and overlying structures in accordance with alternative exemplary embodiments.
Figure 10A:
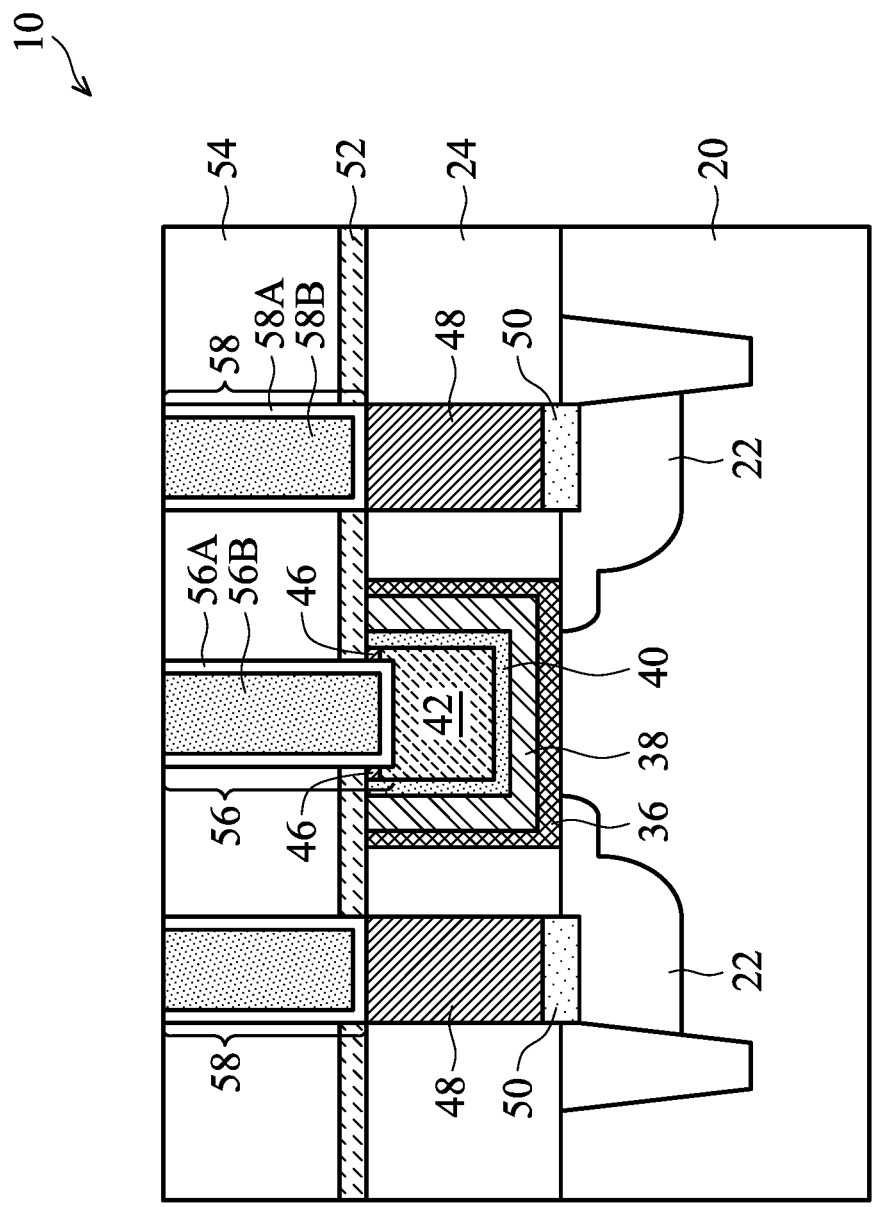
Figure 10C:
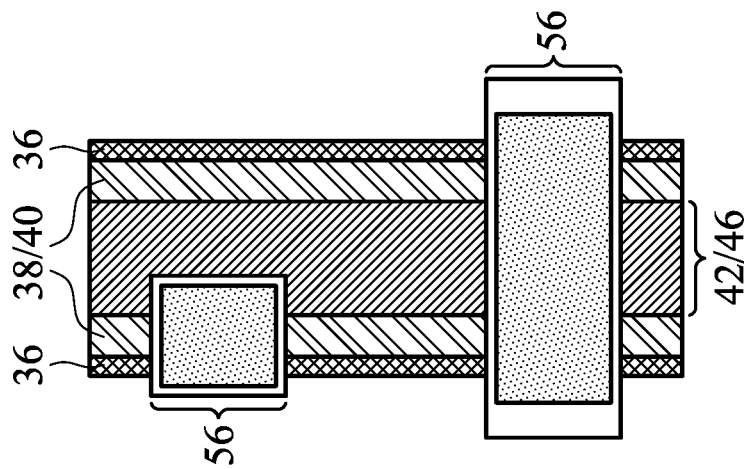
Figure 10B:
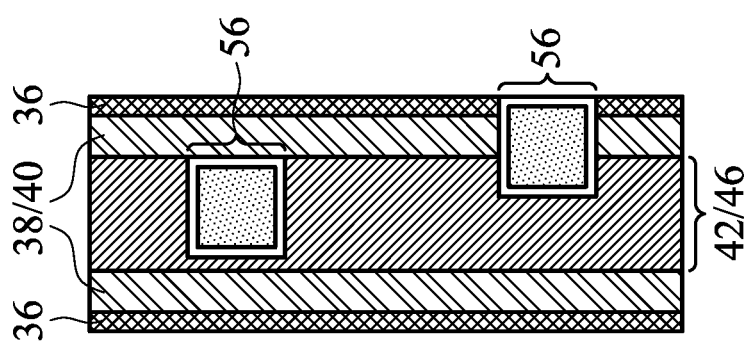
Figure 10D:
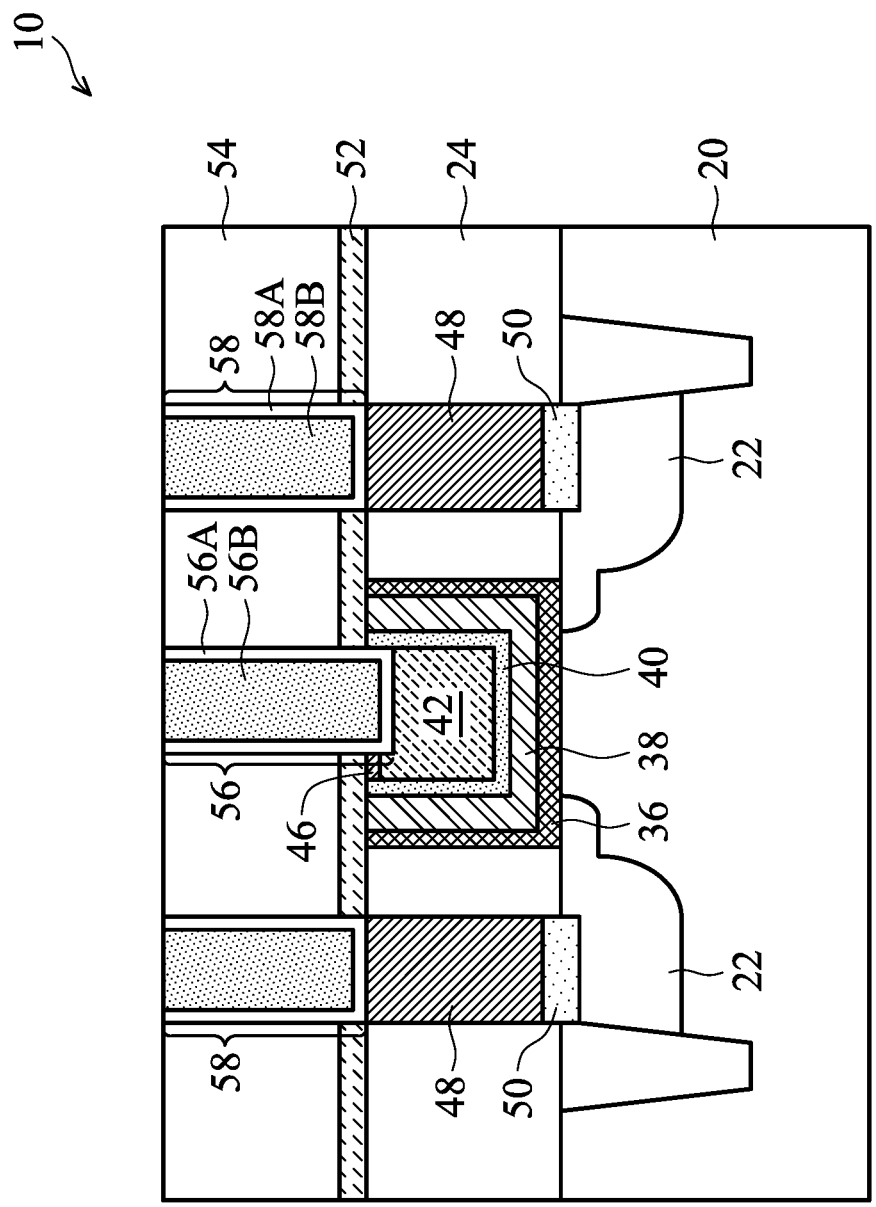
Figure 11:
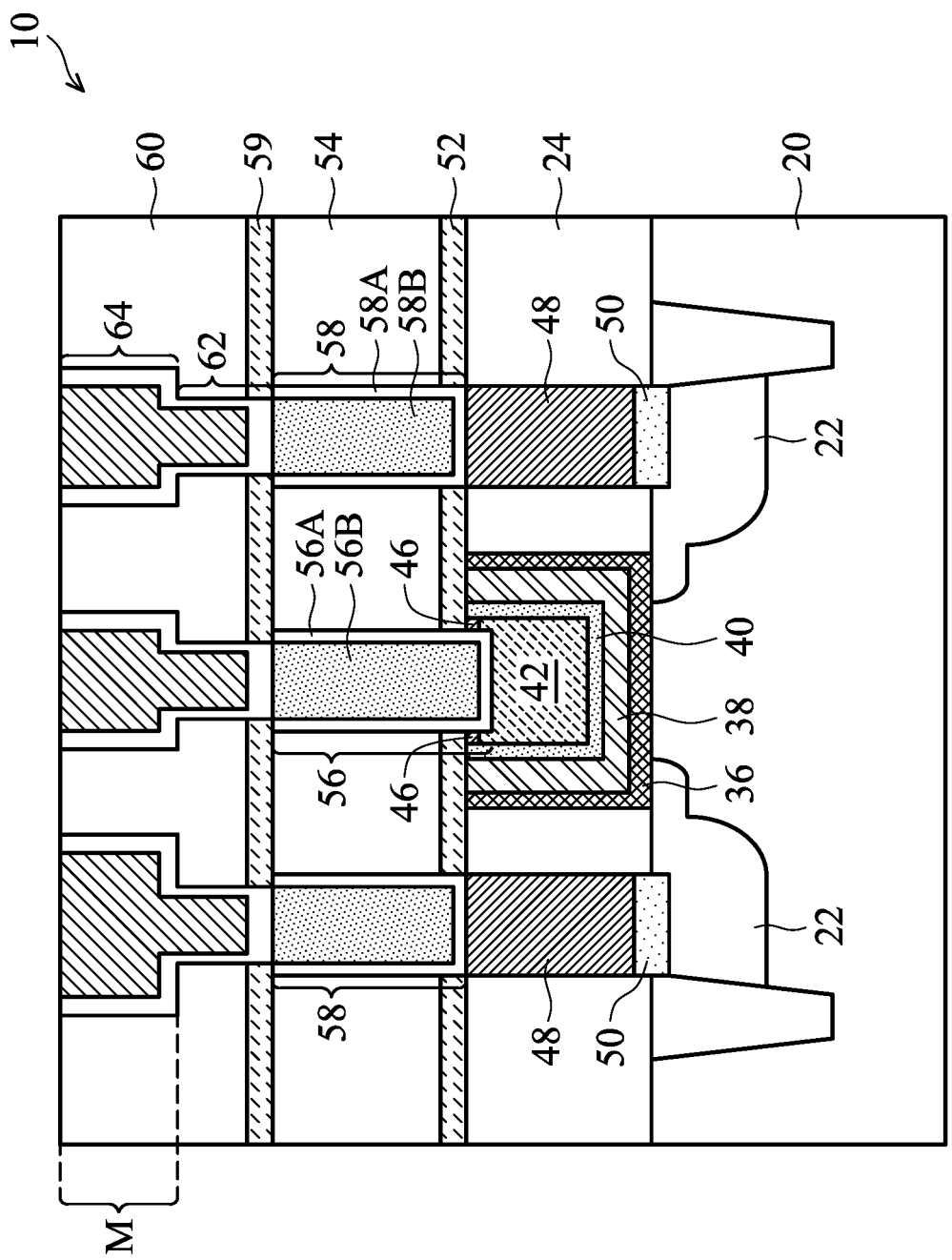

FIGS. 9 through 11 illustrate cross-sectional views of intermediate stages in the formation of a MOS device and overlying structures in accordance with alternative embodiments. Unless specified otherwise, the materials and formation methods of the components in these embodiments are essentially the same as the like components, which are denoted by like reference numerals in the embodiments shown in FIGS. 1 through 8. The details regarding the formation process and the materials of the components shown in FIGS. 9 through 11 may thus be found in the discussion of the embodiments shown in FIGS. 1 through 8.

The initial steps of these embodiments are essentially the same as shown in FIGS. 1 through 6. Next, as shown in FIG. 9, ILD1 54 and the underlying etch stop layer 52 are etched, and openings 70 and 72 are formed. When aluminum oxide layer 46 is formed, the portion of aluminum oxide layer 46 that is exposed through opening 70 is also etched, and the underlying aluminum-containing layer 42 is exposed to opening 70. Next, as shown in FIG. 10A, gate contact plug 56 and M0_OD2s 58 are formed in openings 70 and 72, respectively. Gate contact plug 56 (and barrier layer 56A) is in contact with aluminum-containing layer 42, and penetrates through aluminum oxide layer 46. The respective top views of the structures shown in FIGS. 10A and 10D are illustrated in FIGS. 10B and 10C. As shown FIG. 10B, gate contact plug 56 may either be aligned to, or misaligned with, aluminum oxide layer 46. In particular, FIGS. 10B and 10D illustrate the gate contact plug 56 being aligned to the aluminum oxide layer 46. When gate contact plug 56 is misaligned with aluminum oxide layer 46, a bottom surface of barrier layer 56A may be in contact with the top edges of conductive layer 38 and wetting layer 40. As shown FIG. 10C, gate contact plug 56 may also be wider than aluminum-containing layer 42, and hence may be in contact with the top surface of aluminum-containing layer 42 and the top edges of layers 38 and 40. FIG. 11 illustrates a structure after the formation of metal layer M1.

In the embodiments in FIGS. 8 and 11, either barrier layer 56A includes a titanium layer (which may be substantially pure in accordance with some embodiments), or wetting layer 40 includes the titanium layer. When wetting layer 40 includes the titanium layer, the titanium layer may be in contact with the bottom surface and the sidewalls of aluminum-containing layer 42. In alternative embodiments, titanium layers are formed in both barrier layer 56A and wetting layer 40. The titanium layers help reduce the inter-diffusion of the copper in copper-containing region 56B and the aluminum in aluminum-containing layer 42. In addition, in the embodiments shown in FIG. 8, aluminum oxide layer 46 also help reduce the inter-diffusion.

Although in the embodiments, aluminum-containing gate electrodes and copper-containing contact plugs are used as examples to explain the concepts of the embodiments, the concept of the embodiments may be applied to reduce the inter-diffusion between other aluminum-containing regions and copper-containing regions, which include, and are not limited to, for example, the aluminum-containing metal pads and the overlying copper-containing Post-Passivation Interconnect (PPI) structures. In these embodiments, the aluminum-containing metal pads and the copper-containing PPI structures are formed over all low-k dielectric layers, and wherein the copper-containing PPI structure is further formed over passivation layers.

In accordance with embodiments, a device includes a conductive layer including a bottom portion, and a sidewall portion over the bottom portion, wherein the sidewall portion is connected to an end of the bottom portion. An aluminum-containing layer overlaps the bottom portion of the conductive layer, wherein a top surface of the aluminum-containing layer is substantially level with a top edge of the sidewall portion of the conductive layer. An aluminum oxide layer is overlying the aluminum-containing layer. A copper-containing region is over the aluminum oxide layer, and is spaced apart from the aluminum-containing layer by the aluminum oxide layer. The copper-containing region is electrically coupled to the aluminum-containing layer through the top edge of the sidewall portion of the conductive layer.

In accordance with other embodiments, a device includes a wetting layer, which includes a first bottom portion, and a first sidewall portion over the first bottom portion and connected to an end of the first bottom portion. An aluminum-containing layer overlaps the first bottom portion, wherein a sidewall of the aluminum-containing layer contacts the first sidewall portion of the wetting layer. A barrier layer includes a second bottom portion over and contacting the aluminum-containing layer and a second sidewall portion over the second bottom portion and connected to an end of the second bottom portion. A copper-containing region overlaps the second bottom portion of the wetting layer, and is level with the second sidewall portion of the barrier layer. At least one of the wetting layer and the barrier layer comprises a substantially pure titanium layer.

In accordance with yet other embodiments, a method includes forming a conductive layer comprising a bottom portion, and a sidewall portion over the bottom portion, wherein the sidewall portion is connected to an end of the bottom portion. An aluminum-containing layer is formed over the bottom portion of the conductive layer, wherein an aluminum oxide layer is formed at a top surface of the aluminum-containing layer. A dielectric layer is formed over the aluminum-containing layer, followed by forming an opening in the dielectric layer to expose a top edge of a sidewall portion of the conductive layer, and a portion of the aluminum oxide layer. The opening is filled with a barrier layer and a copper-containing material over the barrier layer. Excess portions of the barrier layer and the copper-containing material are removed. A portion of the barrier layer and a portion of the copper-containing material remaining in the opening form a contact plug, wherein the barrier layer includes a first bottom surface contacting a top surface of the aluminum oxide layer, and a second bottom surface contacting a top edge of the conductive layer.

In accordance with an embodiment, a method includes forming a conductive layer including a bottom portion and a sidewall portion over the bottom portion, wherein the sidewall portion is connected to an end of the bottom portion. The method further includes forming an aluminum-containing layer over the bottom portion of the conductive layer and forming a dielectric layer over the aluminum-containing layer. An aluminum oxide layer is formed at a top surface of the aluminum-containing layer. The method further includes forming an opening in the dielectric layer to expose a top edge of the sidewall portion of the conductive layer and a portion of the aluminum oxide layer, filling the opening with a barrier layer and a copper-containing material over the barrier layer, and removing excess portions of the barrier layer and the copper-containing material. A portion of the barrier layer and a portion of the copper-containing material remain in the opening form a contact plug, and the barrier layer includes a first bottom surface contacting a top surface of the aluminum oxide layer and a second bottom surface contacting a top edge of the conductive layer.

In accordance with an embodiment, a method includes forming a first opening in a first dielectric layer disposed over a substrate and forming a gate electrode in the first opening. The gate electrode includes a first conductive layer and a second conductive layer, wherein the first conductive layer is disposed under a bottom surface and on sidewalls of the second conductive layer. The method also includes forming a non-conductive layer at a top surface of the second conductive layer, wherein the non-conductive layer is disposed between a first portion and a second portion of the second conductive layer. The method also includes forming a second dielectric layer over the first dielectric layer, patterning a second opening in the second dielectric layer to expose the gate electrode, and forming a contact plug in the second opening.

In accordance with an embodiment, a method includes forming a first opening in a first dielectric layer and exposing a substrate, depositing a gate dielectric layer on sidewalls and a bottom surface of the first opening, and forming a gate electrode over the gate dielectric layer. Forming the gate electrode includes depositing a conductive layer over the gate dielectric layer and depositing a wetting layer over the conductive layer. The conductive layer extends along sidewalls of the gate dielectric layer in the first opening, and the wetting layer extends along sidewalls of conductive layer in the first opening. Forming the gate electrode further includes depositing an aluminum-containing layer in the first opening over the wetting layer, removing excess portions of the gate dielectric layer, the conductive layer, the wetting layer, and the aluminum-containing layer over the first dielectric layer; and after removing the excess portions, forming an aluminum oxide-containing layer at a top surface of the aluminum-containing layer. A top surface of the aluminum oxide-containing layer is substantially level with top edges of the wetting layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first barrier layer;
a wetting layer disposed over the first barrier layer;
a conductive layer disposed over the wetting layer, wherein a first sidewall portion of the conductive layer contacts a second sidewall portion of the wetting layer;
a dielectric layer disposed over the conductive layer, the dielectric layer comprising a third sidewall portion contacting the wetting layer; and
a contact plug disposed over the conductive layer, the contact plug physically contacting the dielectric layer and the wetting layer, the contact plug comprising a bottom surface, a first side surface, and a second side surface, wherein the bottom surface is directly interposed between the first side surface and the second side surface, and wherein the first side surface physically contacts the wetting layer.

2. The device of claim 1, wherein the contact plug further physically contacts the conductive layer.

3. The device of claim 1, wherein the contact plug comprises a second barrier layer and a conductive material.

4. The device of claim 1 further comprising a gate dielectric layer underlying the first barrier layer.

5. The device of claim 1, wherein the bottom surface of the contact plug physically contacts the conductive layer.

6. The device of claim 5, wherein the second side surface of the contact plug physically contacts the dielectric layer.

7. The device of claim 6, wherein the second side surface of the contact plug further physically contacts the conductive layer.

8. A device comprising:
a first conductive layer disposed over a substrate, the first conductive layer comprising first sidewall portions and a bottom portion, the first conductive layer being electrically conductive;
a second conductive layer disposed over the first conductive layer, the second conductive layer directly interposed between the first sidewall portions of the first conductive layer;
a dielectric layer disposed over the second conductive layer, the dielectric layer directly interposed between the first sidewall portions of the first conductive layer, the dielectric layer comprising a top surface and a bottom surface; and
a first contact plug disposed over the dielectric layer, a bottom surface of the first contact plug being more proximal to the substrate than the bottom surface of the dielectric layer, the bottom surface of the first contact plug being directly adjacent to a side surface of the first contact plug, the side surface physically contacting one of the first sidewall portions of the first conductive layer.

9. The device of claim 8 further comprising a first barrier layer disposed over the substrate and underlying the first conductive layer, the first barrier layer being electrically conductive.

10. The device of claim 9, wherein the first barrier layer comprises polysilicon, TaSiN, WN, TiAl, TiAlN, or TaC.

11. The device of claim 9 further comprising a gate dielectric layer disposed over the substrate and underlying the first barrier layer.

12. The device of claim 8 further comprising an interlayer dielectric (ILD) disposed around the first sidewall portions of the first conductive layer, a top surface of the ILD being level with a top surface of the first conductive layer.

13. The device of claim 12 further comprising a second contact plug laterally displaced from the first contact plug, a bottom surface of the second contact plug being level with the top surface of the ILD.

14. A device comprising:
a first interlayer dielectric (ILD) disposed over a substrate;
a gate dielectric layer disposed over the substrate and embedded in the first ILD;
a first conductive layer disposed over the gate dielectric layer, the first conductive layer comprising a U-shape;
a second conductive layer disposed over the first conductive layer, a sidewall of the second conductive layer physically contacting an inner surface of the U-shape;
a dielectric layer disposed over the second conductive layer, a first sidewall of the dielectric layer physically contacting at least one of the inner surfaces of the U-shape; and
a first contact plug disposed over the dielectric layer, a sidewall of the first contact plug being level with the sidewall of the second conductive layer, a bottom wall of the first contact plug being directly adjacent to the sidewall of the first contact plug.

15. The device of claim 14, wherein the first contact plug extends through the dielectric layer and physically contacts the second conductive layer.

16. The device of claim 14, wherein the first contact plug comprises a barrier layer and a conductive material, a bottom surface of the conductive material being more proximal to the substrate than a top surface of the dielectric layer.

17. The device of claim 16 further comprising a second contact plug disposed over the substrate, a top surface of the second contact plug being level with a top surface of the first contact plug, the bottom surface of the conductive material being more proximal to the substrate than a bottom surface of the second contact plug.

18. The device of claim 17, wherein the dielectric layer comprises a second sidewall opposite the first sidewall, the second sidewall physically contacting the first contact plug.

19. The device of claim 14 further comprising a third conductive layer interposed between the first conductive layer and the gate dielectric layer.

20. The device of claim 19, wherein the first conductive layer is directly interposed between the first contact plug and the third conductive layer.

* * * * *